United States Patent [19]

Harris

[11] Patent Number: 5,763,905
[45] Date of Patent: Jun. 9, 1998

[54] SEMICONDUCTOR DEVICE HAVING A PASSIVATION LAYER

[75] Inventor: Christopher Harris, Sollentuna, Sweden

[73] Assignee: ABB Research Ltd., Zurich, Switzerland

[21] Appl. No.: 678,458

[22] Filed: Jul. 9, 1996

[51] Int. Cl.$^6$ .................. H01L 31/0312; H01L 23/58
[52] U.S. Cl. .................. 257/77; 257/636; 257/646
[58] Field of Search .................. 257/77, 79, 631, 257/636, 646, 638; 428/539

[56] References Cited

U.S. PATENT DOCUMENTS

| | | | |
|---|---|---|---|
| 3,922,475 | 11/1975 | Manasevit | 428/539 |
| 4,086,613 | 4/1978 | Biet et al. | 257/636 |
| 4,375,125 | 3/1983 | Byatt | 257/636 |
| 5,387,804 | 2/1995 | Suzuki et al. | 257/77 |
| 5,393,993 | 2/1995 | Edmond et al. | 257/77 |
| 5,650,638 | 7/1997 | Harris et al. | 257/636 |

FOREIGN PATENT DOCUMENTS 2 707 425  7/1993  France.

*Primary Examiner*—Tom Thomas
*Assistant Examiner*—Adriana Giordana
*Attorney, Agent, or Firm*—Pollock, Vande Sande & Priddy

[57] ABSTRACT

A semiconductor device comprising at least one SiC semiconductor layer; and passivation layers applied on at least a portion of a surface of the SiC semiconductor layer for passivation thereof; the passivation layers comprising at least a substantially insulating layer comprising crystalline AlN and placed next to the SiC semiconductor layer and a semi-insulating layer allowing a weak current to flow therein in a blocking state of the device; wherein the semi-insulating layer comprises at least one first sub-layer and at least one second sub-layer, the at least one first sub-layer having a smaller gap between a conduction band and a valence band thereof than the at least one second sub-layer and the at least one second sub-layer having dopants for auto-ionization thereof by transport of charge carriers thereof to a deeper energy state in the semi-insulating sub-layer.

18 Claims, 1 Drawing Sheet

SEMICONDUCTOR DEVICE HAVING A PASSIVATION LAYER

TECHNICAL FIELD

The present invention relates to a semiconductor device comprising at least one semiconductor layer of SiC and a layer applied on at least a portion of a surface of the SiC-layer for passivation thereof. The passivation layer comprises at least two superimposed sub-layers of which a first one is a substantially insulating layer and a second one is a semi-insulating layer allowing a weak current to flow therein in a blocking state of the device.

BACKGROUND OF THE INVENTION

All types of semiconductor devices are included, such as for example different types of diodes, transistors and thyristors.

One of the tasks to fulfil for a passivation layer in such a device is to stabilize the surface region of the semiconductor layer, which then has also a stabilizing effect on the properties in the bulk of the semiconductor layer. In particular, the passivating layer has to electrically shield the semiconductor layer of the device with respect to the ambient, so that electrical fields from the device will not detrimentally influence surrounding devices or equipment. As a result there will be no generation of jumping sparks at the interface between the semiconductor layer and the air and no breakdown in a blocking state of the device, when the passivation layer is applied in a region of the device where the electric field is high in a blocking state of the device. One of the main advantages of such semiconductor layers of SiC is that SiC has a high breakdown field, which is more than 5 times higher than Si. Thus, SiC is well suited as a material in high power devices operating under conditions where high voltages may occur in the blocking state of a device. The arrangement of the semi-insulating layer allow a weak current to flow; therein in a blocking state of the device will smooth out the electric field in the region of the semi-insulating layer and avoid field concentrations. As a result, such a device may withstand higher voltages in the blocking state than otherwise.

Examples of semi-insulating layers that have been used for Si power devices are SIPOS (semi-insulating polycrystalline oxidized silicon) or amorphous carbon, both of which are non-epitaxial layers and have a high density of trapping defects. In the case of a Si power device the substantially insulating layer is made of $SiO_2$ and placed on top of the semi-insulating SIPOS-layer. This is necessary to prevent charge injection into the $Sio_2$-layer. $SiO_2$ is also amorphous which means a high density of traps and instability at the interface with the semiconductor layer. For the wide band gap SiC these layers have been found to be unsuitable due to the transfer of charge to the interface and the resulting depletion of the SiC. Furthermore, SIPOS may not be used at the high temperatures that SiC may withstand, since the conductivity thereof will increase so much that it does not act as a semi-insulating layer any longer. Therefore, it would not be possible to benefit from the particular property of SiC to operate at high temperature, namely up to 1000° K, if SIPOS were used as semi-insulating layer.

SUMMARY OF THE INVENTION

The object of the present invention is to provide a semiconductor device as defined in the introduction, which has a passivation making it possible to withstand breakdown fields close to the physical limit of SiC and be thermally stable in the temperature range in which SiC-devices may operate.

This object is in accordance with the invention, obtained by placing the first layer next to the SiC-layer and at least next to the SiC-layer of crystalline AlN, and by making the semi-insulating layer of a crystalline material having a good lattice-match to AlN and placing it on top of the first AlN-layer.

Crystalline AlN has a 2H-structure and will match under given orientations with all types of SiC-polytypes, both cubic and hexagonal ones, and it has a good lattice-match with a misfit of only 0.7%. Accordingly, the interface between the SiC-layer and the insulating layer of AlN will be very good and have "bulk-like" character with a minimum of traps. Furthermore, AlN has nearly the same dielectric constant as SiC and is able to withstand electric fields of a greater magnitude than SiC. It is also thermally stable within the possible temperature range of operation of SiC-devices. It is possible to place the AlN-layer closest to the SiC-layer and thus obtain a high quality interface at the SiC-surface, since AlN is less susceptible to damage by charge injection since it is a single crystal. As a result it should not be necessary to have a current path at the interface. Thus, the semi-insulating layer may be kept at a distance from the SiC-layer, and the insulating layer will reduce the electric field reaching the semi-insulating layer. An important advantage compared to the Si-case is that insulating layer and the semi-insulating layer, may be grown in one and the same step by epitaxy.

According to a preferred embodiment of the invention the first layer having at least next to the SiC-layer a content of Boron being 2–5% with respect to the content of AlN. Thus, the definition in claim 1, that the substantially insulating layer is made of crystalline AlN will also include the addition of minor concentrations of other elements thereto. It has been found that the addition of Boron of the content mentioned may improve the lattice-match with respect to SiC, so that SiC and this layer will be substantially completely lattice-matched further reducing the trap density at the interface.

According to another preferred embodiment of the invention the semi-insulating layer is made of $Al_yNX_{1-y}$, in which X is one of a) a group 3A-element and b) several group 3A-elements and $0<y<1$.

Such a layer containing other group 3B-elements has good lattice-match to AlN and the gap between the valence band and the conduction band thereof will be smaller than in AlN. Thus, it will be easy to obtain a lower resistivity therein than in AlN by doping it lightly, so that a weak current may flow therein in a blocking state of the device.

According to another preferred embodiment of the invention the semi-insulating layer is made of $Al_yGa_{1-y}N$. It has been found that this material will be very suited as material for the semi-insulating layer. This layer will have a good-lattice match with AlN, has a chemical inertness and physical hardness, and may as already mentioned, be integrally grown with the AlN-insulating layer. The band gap of the semi-insulating layer material may be tuned to assist in achieving an appropriate conductivity by varying the content of Ga therein. The doping concentration will also influence the conductivity thereof.

According to another preferred embodiment of the invention the content of Al in the material of the semi-insulating layer decreases in the direction away from the insulating layer of AlN. This results in a good interface quality between the insulating layer and the semi-insulating layer, but nevertheless conductivity being high enough in the semi-insulating layer.

According to another preferred embodiment of the invention the semi-insulating layer comprises at least one sub-layer having a smaller gap between the conduction band and the valence band thereof than a layer next thereto, and the layer last mentioned is provided with dopants for auto-ionization of these dopants by the transport of charge carriers thereof to a deeper energy state in the semi-insulating sub-layer. In this way a very serious problem with using conventional materials, such as SIPOS, as semi-insulating layer for SiC power devices is solved.

This problem will now be described. The large range of temperature over which a SiC power device should operate places severe constraints on the allowed temperature gradient of the conductivity. SIPOS has a strong temperature dependence, which may partly be explained by the nature of conductivity in the amorphous/polycrystalline layer, and an increase in conductivity of some five orders of magnitude is observed in raising the temperature from room temperature to 300° C. This is due to the fact that both the degree of ionization of impurities and the mobility increase with the temperature in this material. In comparison the corresponding change in single crystal SiC is a decrease of approximately a factor 3. Here the mobility decreases with increasing temperature, but the ionization degree does not. A still weaker dependence can be expected for a wider gap material. A potential problem with using wide gap materials is the low ionization at low temperatures, so that start-up operating temperature of −50° C. can imply an ineffective passivation and possible failure. In addition SiC has the potential to work at much higher temperatures, so that the conductivity should therefore ideally be largely temperature independent. By doping the layer having the wider band gap the dopants are auto-ionized thereby forming a channel of charge in the smaller gap material. This method is called modulation doping. This means that the dopant is ionized at all temperatures removing a significant contribution to the temperature dependence of the conductivity and making it more temperature stable.

According to a preferred embodiment of the invention being a development of the embodiment last mentioned the layer provided with dopants is made of AlN. AlN is not difficult to dope, but it is very difficult to activate dopants in AlN, since the dopants have a very high ionization energy in AlN. It will thus be possible to use this material, preferred in substantially all other aspects, for obtaining a nearly temperature independent conductivity in a semi-insulating layer and a steady operation of such a semiconductor device over a wide temperature range.

According to another preferred embodiment of the invention the semi-insulating sub-layer is made of SiC. The advantage of making the semi-insulating sub-layer of SiC is that it brings less strain in the system, since it is be very well lattice-matched with the substantially insulating layer of AlN.

According to another preferred embodiment of the invention said semi-insulating sub-layer is made of $Al_yGa_{1-y}N$, in which $0<y<1$, which is easily grown on top of the AlN-layer, and the auto-ionization of this layer will be easily controlled.

According to another preferred embodiment of the invention the semi-insulating layer comprises a plurality of the semi-insulating sub-layer and doped layers having a larger gap between the conduction band and the valence band than the sub-layers placed alternatingly on top of each other for forming a so called superlattice. This will be a very advantageous structure for the semi-insulating layer, since a plurality of layers will smooth out variations of the doping concentration in each of the doped layers. Thus, there will be a well controlled, nearly temperature independent flow of charge carriers in the semi-insulating sub-layers through the auto-ionization of the doped layers placed therebetween. The current flow is allowed in the plane of the device but limited perpendicularly thereto, namely in the direction of a higher electric field as desired. Furthermore, the conductivity of the sub-layers may be determined by the doping concentration of that layer, which however also may be undoped, the doping concentration of the doped layers having a wider band gap and the material and by that the ionization energy of possible dopants in that material.

Further advantage as well as preferred characteristics of the invention will appear from the following description and the other dependent claims.

BRIEF DESCRIPTION OF THE DRAWINGS

With reference to the appended drawings, below follows a specific description of preferred embodiments of the invention.

In the drawings.

DETAILED DESCRIPTION OF PREFERRED EMBODIMENTS

Figure 1:
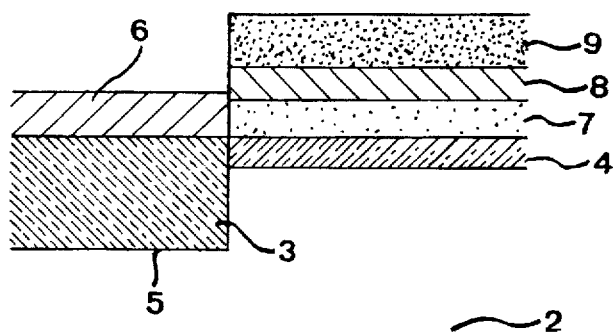
FIG. 1 is a schematic cross-section of a semiconductor device according to the invention.
Figure 1:

FIG. 1 illustrates by way of a non-limitating example, a device to which the invention may be applied, a semiconductor diode with the following semiconductor layers of SiC: a highly doped layer 1 of n-type, which is intended to have a contact not shown applied thereto, a low doped layer 2 of n-type adapted to form the space charge region of the device and a layer 3 being highly doped and of p-type. The layer 3 is produced through implantation of acceptors, such as for example Al and B into the SiC-crystal. The low doped n-type layer 2 has also a sub-layer 4, which may have a doping concentration varying in the direction away from the pn-junction 5 of the device for junction termination purposes. The device has also a contact electrode 6 applied on the implanted p-type layer 3. For passivation purposes a substantially insulating layer 7 of AlN and a semi-insulating layer 8 are applied in the order mentioned upon the sub-layer 4 of the SiC-layer 2. Furthermore, an additional insulating passivation layer 9, which may be amorphous, is applied on the semi-insulating layer 8.

The present invention is directed to the passivation layer formed by the substantially insulating layer 7 and the semi-insulating layer 8 on top thereof. The substantially insulating layer 7 is made of AlN, which means that the interface between this layer and the SiC sub-layer 4 may have a high quality with a low density of traps as a consequence of the very good lattice-match between SiC and AlN. If a small content of Boron, namely 2–5% with respect to the content of Al, is added to this layer, at least next to the SiC-layer, this lattice-match will be further improved. The AlN-layer may withstand very high voltages in the blocking state of the device and the low density of traps at the interface will make the behavior of the device in this region very stable. The semi-insulating layer 8 is made of a material with a good lattice-match to AlN, and this material may for instance be SiC, is favorable due to lesser strain in the system due to the good lattice-match between SiC and AlN. However, it is rather difficult to control the conductivity of such a SiC-layer when it is based on auto-ionization, which is to prefer (see further below).

Figure 2:
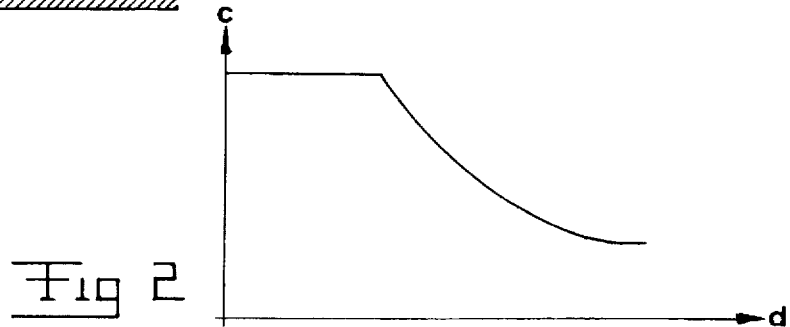
FIG. 2 is a view illustrating how the concentration of Al may vary in the direction away from the SiC-layer in the semiconductor device according to FIG. 1.

It has been found that it is very advantageous to make the semi-insulating layer 8 of $Al_yGa_{1-y}N$, in which $0<y<1$, with a small content of indium. This material will have a good lattice-match to AlN and may be epitaxially grown thereon in one and the same process step. It is shown in FIG. 2 how the concentration c of Al may vary in the direction away from the SiC-layer, with increasing distance d from this layer, and how the content of gallium will gradually increase from the interface 10 between the substantially insulating layer 7 and the semi-insulating layer 8. The semi-insulating layer 8 is preferably lightly doped to obtain a resistivity turning it into a semi-insulating material. Thus, a weak leakage current may flow substantially horizontally, as seen in FIG. 1, in this semi-insulating layer in the blocking state of the device, i.e. when a negative voltage is applied to the contact layer 6, for smoothing out the electric field in the region of the pn-junction 5 and by that removing concentrations of electric field.

Figure 3:
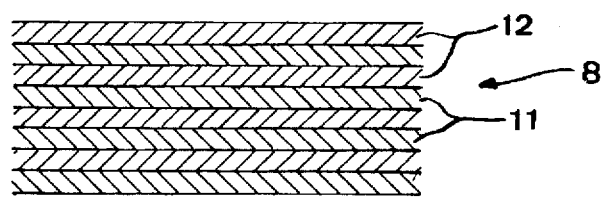
FIG. 3 is an enlarged cross-section view of the semi-insulating layer in a semiconductor device according to a second preferred embodiment of the invention.
Figure 4:
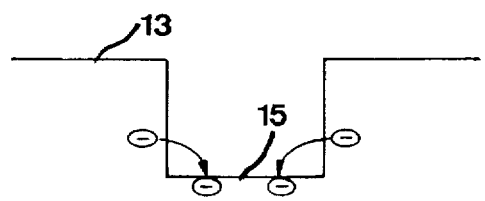
FIG. 4 is a diagram showing the extension of the valence band and the conduction band across sub-layers of the semi-insulating layer shown in FIG. 3 and how dopants provided in the layers having a wider band gap may be auto-ionized.
Figure 4:
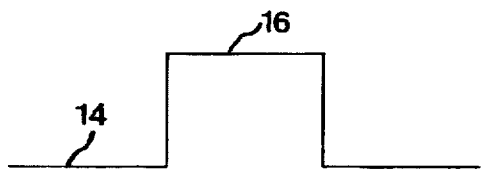

FIG. 3 shows how the semi-insulating layer 8 may look like in a preferred embodiment of the invention. This layer is formed by a number of first sub-layers 11 of a material having a smaller gap between the conduction band and the valence band thereof than second sub-layers 12 placed therebetween. The second sub-layers 12 are preferably made of AlN, and the first sub-layers 11 may be made of for instance SiC, AlGaN or GaN. The second sub-layers 12 are lightly doped, which results in an auto-ionization of the dopants therein due to the wider band gap than in the first sub-layers adjacent thereto, so that transport of charge carriers from the second sub-layers 12 into the first layers 11 will take place as illustrated in FIG. 4. 13 and 14 indicate the extension of the conduction band and the valence band, respectively, in a second layer 12 and 15 and 16 indicate corresponding bands for a first layer 11. The conductivity of, a semi-insulating layer of for instance, SiC or AlGaN will normally, i.e. without any such auto-ionization, depend upon the ionization of impurities therein, which will increase with the temperature, and the charge carrier mobility therein, which will decrease with the temperature. The conductivity will therefore be maximum for a certain temperature, which may for AlGaN be dependent on the content of Ga therein. A higher Ga-content will also result in a smaller band gap and in a higher conductivity due to ionization of dopants in the semi-insulating layers. Thanks to the auto-ionization a contribution to the conductivity being largely independent of the temperature of the material of the semi-insulating layer will be made, so that the conductivity will be substantially temperature independent. In this way the widest possible operation range of a SiC power device may be utilized. A current flow will be allowed in the plane of the device but a perpendicular flow will be limited. Channels of charge in the smaller gap material, i.e. in the first sub-layers, may be created by this so called modulation doping. It would of course also be possible to have only one layer of a smaller band gap and utilize the auto-ionization for determining the conductivity thereof, but it is advantageous to have a number of alternating layers, since they will smooth out variations of doping concentration thereof and in the wider band gap material. The sub-layers in the superlattice may be very thin and have preferably a thickness below 200Å and most preferred below 75Å.

The possible dopants for the semi-insulating layer may be standard dopants known for 3A-nitride materials, such as Si, C, Mg, Be and Ge.

The invention is of course not in any way restricted to the preferred embodiments described above, but many possibilities to modifications thereof will be apparent to a one ordinary skilled in the art.

The proportions of the different layers shown in the figures are only chosen for illustration reasons and can be totally different.

All definitions concerning the materials of the different device layers do of course also include inevitable impurities as well as intentional doping.

The definition layer is to be interpreted broadly and comprises all types of volume extensions and shapes.

The word crystalline means a good periodicity of the lattice in the three dimensions over great regions, i.e. typically polycrystalline structures are excluded.

The claim definition concerning the layer provided with dopants for auto-ionization of these dopants by transport of charge carriers thereof to a deeper energy state in a semi-insulating sub-layer is intended to also include the case in which the substantially insulating layer of AlN constitutes the doped layer, and there may possibly only be one single semi-insulating layer on top thereof, since the AlN-layer will in any case be substantially insulating.

It is not necessary that the entire substantially insulating layer be made of crystalline AlN, but it would be sufficient if it is made of crystalline AlN next to the SiC-layer for obtaining a good lattice-match thereto, and the content of Al may decrease in the direction away from the SiC-layer.

I claim:

1. A semiconductor device comprising
   at least one SiC semiconductor layer, and
   passivation layers applied on at least a portion of a surface of said SiC semiconductor layer for passivation thereof, said passivation layers comprising at least a substantially insulating layer comprising crystalline AlN and placed next to said SiC semiconductor layer and a semi-insulating layer allowing a weak current to flow therein in a blocking state of the device,
   wherein said semi-insulating layer comprises at least one first sub-layer and at least one second sub-layer, said at least one first sub-layer having a smaller gap between a conduction band and a valence band thereof than said at least one second sub-layer and said at least one second sub-layer having dopants for auto-ionization thereof by transport of charge carriers thereof to a deeper energy state in said semi-insulating sub-layer.

2. A device according to claim 1, wherein said substantially insulating layer comprises about 2–5% Boron.

3. A device according to claim 1, wherein said semi-insulating layer is made of $Al_yNX_{1-y}$, where X is one of a group of 3A-element and several group 3A-elements and $0<y<1$.

4. A device according to claim 3, wherein said semi-insulating layer is made of $Al_kGa_lIn_mN$, where $k+l+m=1$.

5. A device according to claim 4, wherein the content of Al in the material of said semi-insulating layer decreases in the direction away from said insulating layer of AlN.

6. A device according to claim 3, wherein said semi-insulating layer is made of $Al_yGa_{1-y}N$.

7. A device according to claim 6, wherein the content of Al in the material of said semi-insulating layer decreases in the direction away from said insulating layer of AlN.

8. A device according to claim 3, wherein the content of Al in the material of said semi-insulating layer decreases in the direction away from said insulating layer (7) of AlN.

9. A device according to claim 1, wherein said second sub-layer provided with dopants is doped with donors, so that electrons are provided as charge carriers in said first sub-layer.

10. A device according to claim 1, wherein said second sub-layer provided with dopants is made of AlN.

11. A device according to claim 10, wherein said first sub-layer is made of $Al_yGa_{1-y}N$, in which $0<y<1$.

12. A device according to claim 10, wherein said first sub-layer is made of GaN.

13. A device according to claim 1, wherein said first sub-layer is made of SiC.

14. A device according to claim 1, having a plurality of first and second sub-layers placed alternatingly on top of each other to form a superlattice.

15. A device according to claim 14, wherein said first and second sub-layers forming said superlattice have a thickness less than 200 Å.

16. A device according to claim 15, wherein said thickness is less that 75 Å.

17. A device according to claim 1, wherein said first sub-layer is doped.

18. A semiconductor device comprising
at least one SiC semiconductor layer, and
passivation layers applied on at least a portion of a surface of said SiC semiconductor layer for passivation thereof, said passivation layers comprising at least a substantially insulating layer comprising crystalline AlN and placed next to said SiC semiconductor layer and a semi-insulating layer allowing a weak current to flow therein in a blocking state of the device, and comprising a material including Al, wherein the A content decreases in a direction away from said substantially insulating layer.

* * * * *